United States Statutory Invention Registration [19]

[11] Reg. Number: H629

Murdoch

[43] Published: Apr. 4, 1989

[54] NON-DESTRUCTIVE SEMICONDUCTOR CHIP BONDING AND CHIP REMOVAL

[75] Inventor: Francis J. Murdoch, Monmouth Beach, N.J.

[73] Assignee: The United States of America as represented by the Secretary of the Army, Washington, D.C.

[21] Appl. No.: 2,835

[22] Filed: Jan. 9, 1987

[51] Int. Cl.[4] ..... H01L 23/16; H01L 39/02; H01L 23/56

[52] U.S. Cl. ..... 357/75; 357/28; 357/67; 357/80

[58] Field of Search ..... 357/75, 80, 28, 74, 357/67

[56] References Cited

U.S. PATENT DOCUMENTS 3,289,046 11/1966 Carr ..... 357/75
4,561,006 12/1985 Currie ..... 357/74

*Primary Examiner*—Stephen C. Buczinski
*Assistant Examiner*—Linda J. Wallace
*Attorney, Agent, or Firm*—Sheldon Kanars; John K. Mullarney

[57] ABSTRACT

An arrangement and method for mounting IC chips or dice onto substrates comprises the use of (a pair of) electrically conductive electrodes placed on a substrate below the location where the IC chip is to be mounted. The electrodes are separated a distance that is approximately equal to the width of the IC chip to be mounted. A resistor material is disposed between the electrodes, or may even be integral therewith. The IC chip is placed above the resistor material, it is insulated from the latter, and it abuts a layer of bonding material (e.g., eutectic solder or epoxy) on its underside. A voltage applied to the electrodes heats the resistor material which, in turn melts or cures the bonding material to thereby secure the IC chip in place on the substrate.

1 Claim, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

NON-DESTRUCTIVE SEMICONDUCTOR CHIP BONDING AND CHIP REMOVAL

The invention described herein may be manufactured, used and licensed by or for the Government for governmental purposes without the payment to me of any royalties thereon.

TECHNICAL FIELD

The present invention relates generally to integrated circuit (IC) die mounting into packages and onto hybrid microcircuits and, more particularly, to an arrangement and method for non-destructively bonding, and removing, IC chips onto, and from, packages and hybrid circuits.

BACKGROUND OF THE INVENTION

A problem that is encountered with the mounting of semiconductor IC chips or dice into packages and onto hybrid microcircuits is subjecting the entire package and other components (e.g., capacitors) to excessive heat. The common, prior art, methods of attaching IC chips to packages and substrates are eutectic die bond, eutectic perform reflow and polymer die bonding. All of these techniques require heat that elevates the package/substrate temperature. The eutectic and eutectic preform reflow die bonds are performed at about 400° C. The epoxy cure temperatures are upwards of 200° C. Because of these high temperature exposures, it is usually necessary to attach an IC die on a substrate before adding other chips and/or discrete components, or mounting the substrates into packages. At the least, this approach is inefficient.

To remove a defective integrated circuit chip from a package/substrate it has been necessary heretofore to, once again, subject the entire package/substrate to a high temperature to melt the bond holding the defective chip in place. This has the disadvantageous tendency to melt the eutectic solder (or destroy the epoxy) bonding other IC chips to the same substrate. Moreover, various other circuit components (e.g., capacitors, chip resistors) mounted on the reheated substrate and even the substrate bond-to-package, can be deleteriously effected by this reheating operation.

The above-discussed problems can be overcome by carrying out integrated circuit chip bonding/removal in accordance with the principles of the present invention.

SUMMARY OF THE INVENTION

It is a primary object of the present invention to provide a source of heat that is quite localized with respect to the integrated circuit chip to be mounted/removed.

A related object of the invention is to facilitate the removal of a defective IC chip or die without affecting in any way the package or hybrid circuit carrying the chip.

The foregoing and other objects are achieved in accordance with the present invention by the use of a pair of electrically conductive (e.g., metal) electrodes placed, for example, on a substrate at the location where an IC chip is to be mounted. The electrodes are separated a distance that is approximately equal to the width of the IC chip. A resistor material is disposed between the electrodes. The IC chip is placed above the resistor material, it is insulated from the latter and it abuts a layer of bonding material (e.g., eutectic solder or epoxy) on its underside. A voltage applied to the electrodes heats the resistor material which, in turn, melts (or cures) the bonding material to thereby secure the IC chip in place on the substrate.

It is a particularly advantageous feature of the invention that a defective IC chip an be readily removed for rework or replacement without destroying or damaging, in any way, the package or hybrid circuit associated with the defective chip.

BRIEF DESCRIPTION OF THE DRAWINGS

The invention will be more fully appreciated from the following detained description when the same is considered in connection with the accompanying drawings, in which.

DETAILED DESCRIPTION

Figure 1:
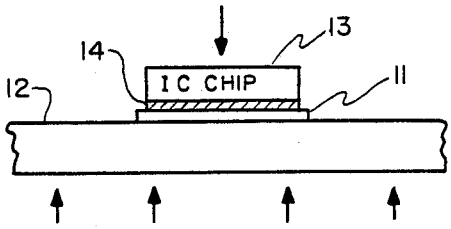
FIG. 1 (PRIOR ART)
FIG. 1 is an enlarged showing of a typical, prior art, semiconductor, integrated circuit, mounting arrangement.

Turning first to the prior art semiconductor integrated circuit mounting arrangement illustrated in FIG. 1 of the drawings, a metallic thick film layer 11 is mounted on a conventional substrate 12. The metal 11 can be comprised of gold, or any of the other known metals used in this art for the same purpose. The substrate 12 is comprised of alumina ($Al_2O_3$) or any common substrate used in thick film technology. The integrated circuit 13 is bonded to the thick film metal material 11 by a utectic solder or epoxy 14. This bonding is carried out by the application of heat, indicated by the arrows in FIG. 1, to the underside of the substrate 12. A typical temperature for this bonding operation is approximately 400° C. The metal layer 11 is applied to the substrate by means of standard thick film processing techniques.

Now if, during subsequent use, the integrated circuit chip 13, sometimes called a die, becomes defective, it is necessary to remove the same from the substrate. This removal is done by the reapplication of heat to the underside of the substrate in combination with heat provided by a focused light beam from a hot spot hybrid die bonder. A typical die bonder for this purpose is one produced by Kulicke & Soffa Industries, Inc., Model 643. The combination of the heat from the focused light beam on the IC chip and the application of heat to the underside of the substrate serves to melt the utectic solder 14, permitting the removal of the integrated circuit chip or die 13. A major disadvantage of this technique is that there may be other IC chips mounted on the same substrate and/or other circuit components. While the heat generated by the focused light beam is concentrated on the IC chip, the heat applied to the underside of the substrate is applied to the whole substrate. This has a tendency to melt the eutectic solder used to bond other IC chips, and/or alternatively to degrade the epoxy that is used with some other IC chips and the substrate to package bond. In addition, the application of this heat can have deleterious effects on the various other circuit components (e.g. capacitors) mounted on the substrate. Further, the heat applied by the focused light beam (depicted by the descending arrow in FIG. 1) might damage an expensive integrated circuit so that it may need to be replaced. Since the IC chip mounting depicted in FIG. 1 is a standard state of the art arrangement, further detailed description of the same would not appear to be warranted.

Figure 2:
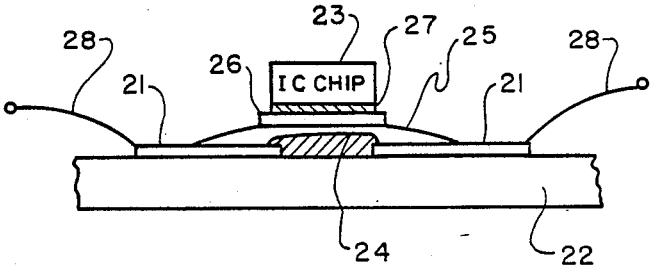
FIG. 2 illustrates an IC chip mounting arrangement in accordance with the present invention.

Turning now to FIG. 2, there is shown an integrated circuit chip or die mounting arrangement in accordance with the present invention. A pair of thick film metal electrodes 21 are deposited on the substrate 22. The metal electrodes 21 are separated by a distance (0.1" to 0.5") which is approximately equal to the width of the IC chip 23 to be mounted. The metal electrodes are formed of gold, platinum gold or any other appropriate thick film metal. The inner ends of the metal electrodes are extended (into the plane of the paper) so that they are more or less co-extensive with the other dimension (e.g., length) of the IC chip. In accordance with standard thick film processing after the metal electrodes are deposited on the substrate, by screen printing, the substrate is then "fired." A resistance or resistor material 24 such as any common thick film resistor material, e.g., such as produced by DuPont, is deposited as a thick film between the metallic electrodes. The resistor material 24 will typically overlap the end portions of the metallic electrodes 21 as illustrated in FIG. 2. The resistor material can be purchased in ohms/square. For present purposes the resistor material should have a low ohms/square value (1 to 10 ohms). After the resistor material is deposited between the metallic electrodes, it too is then fired. Next, a thick film glass dielectric material 25 is screen printed and it encompasses the entire resistor material 24 and a portion of the electrodes 21. This glass is then also fired. As will be appreciated by those skilled in the art, the purpose of the glass 25 is to insulate the resistor material 24 from the thick film metal layer 26 which is placed on the upper surface of the glass. After the metal 26 is deposited, it too is fired. The thick film metal 26 can comprise a platinum gold composition, rather than pure gold which leaches with the application of solder. The IC chip 23 is then bonded to the thick film metal layer 26 by means of a eutectic solder 27 such as gold silicon or gold germanium. However, unlike the prior art techniques, the eutectic solder is melted by means of heating the resistor material 24. For this purpose, a pair of leads 28 are bonded to the outer ends of the metallic electrodes 21. A low voltage (e.g. 10–20 volts) is then applied to the leads 28 causing the resistor material 24 to heat to a high temperature in the range of 400° C. This heat is conducted through the glass (1 mil) and the metal (1 mil) and serves to melt the utectic solder binding the chip to the metal 26. As will be appreciated by those skilled in the art, the deposition of the various thick film layers and the subsequent firing of the same is typically conducted as a continuous automatic process.

A particularly advantageous feature of the present invention is the ability to remove a chip or die for rework or replacement without destroying the package, or hybrid circuit components, such as other IC chips or discrete components (e.g., capacitors) mounted on the same substrate. To remove a defective IC chip it is only necessary to reapply voltage to the leads 28, this in turn heats the resistor 24 to melt the utectic 27 permitting the removal of the defective chip 23. Thus, the heat is very localized and has no effect whatsoever on other IC chips or circuit components mounted on the same substrate.

As will be evident to those skilled in the art, if an epoxy is used for bonding the IC chip in place, the metal layer 26 can be dispensed with and the chip bonded, in the manner described, to the glass 25.

Figure 3:
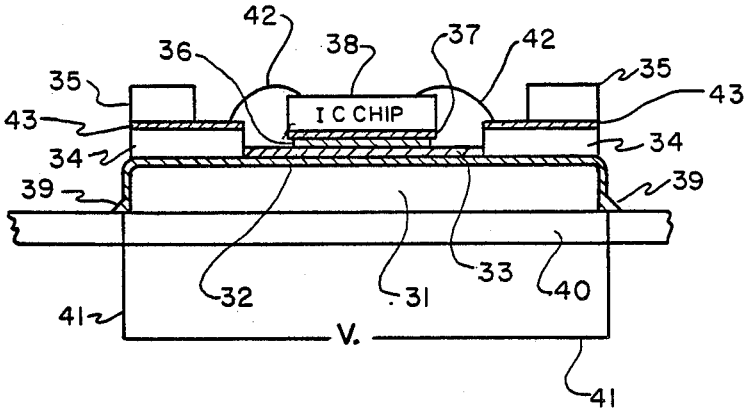
FIG. 3 shows a single chip package incorporating the principles of the invention.

The principles of the present invention can be readily utilized in a large single chip package such as typically used for HSIC and VLSI chips or dies. A typical arrangement of a single chip package incorporating the principles of the present invention is illustrated in FIG. 3 of the drawings. The package shown is a ceramic chip carrier package that is used throughout the industry. The package is normally made by the known ceramic co-fired process. The material for the body of the package is usually alumina (aluminum oxide) 31, 34 and 35. Using the thick film process, a thin layer of tungsten or molymanganese metal 32 is applied to the unfired green ceramic (i.e., alumina) 31 on the top and the sides thereof. A ceramic slip 33 is applied to the top of the tungsten thick film in the area that comprises the cavity of the package. The cavity of the package is defined by the next layer of ceramic 34, usually square configuration. A ceramic "corral" 35 also of square configuration is deposited on the ceramic 34. After the slip 33 is deposited, a layer of tungsten 36 is deposited on the slip material 33. This sandwich is then fired at a very high temperature, typically 1800° C. The firing is done prior to the placing and bonding of the IC die. After firing, all exposed metal areas are gold plated. A thick film or preform of eutectic solder 37 is placed on the gold plated layer 36 and the IC chip or die 38 is placed on top of this utectic. The tungsten resistor material 32 that is deposited on the top and the sides of the ceramic substrate 31 is soldered to a printed circuit board or ceramic mother board 40 by means of solder 39. The last step in the process is to apply a voltage of approximately 10–20 volts via the leads 41 to the solder 39 and thence to the resistor material 32, and this causes a high temperature to be applied to the utectic 37 to thereby secure the IC die to the package.

The gold or aluminum wires 42 attach to particular points on the IC die. These wires electrically connect the chip to the external circuit(s) via the thick film tungsten layer 43. In this manner the integrated circuit is electrically interconnected with the various other electrical components of the circuit board. As will be known to those in the art, there are a great number of wires 42 and tungsten strips 43 that comprise separate and distinct electrical connections between specific points on the IC chip and on the circuit board.

Heretofore, when an IC die was defective, it was necessary to reheat the solder 37 to remove the entire IC package from the circuit board. A high temperature was then applied to the IC package, as heretofore described. This technique has a detrimental effect on the package and also, of course, on the printed circuit board. Besides being cumbersome and time consuming, it will be appreciated by those in the art that the VLSI and VHSIC package is quite expensive and this is a very inefficient and expensive way to remove a defective IC chip. However, in accordance with the principles of the present invention, it is merely necessary to reapply voltage to the leads 41 so as to deliver the necessary heat by means of the resistor material 32, which heats the utectic 37 permitting the IC die to be removed and replaced by a substitute IC die put in its position.

While the principles of the present invention have been disclosed for use in a thick film process arrangement and die bonding procedure, it will be clear to those skilled in the art that the invention has equal applicability to semiconductor die bonding using thin film processes. Also, rather than using the leads 28 in FIG. 2 to apply the voltage to the metal electrodes, electrical probes can be brought down into electrical contact with the electrodes so as to apply the requisite voltage. These probes could then be removed after the IC chip is secured in position. As will be further evident to those in the art, the previously described sandwich of thick film materials can be fired separately or, alternatively, can be fired in combination. Without further belaboring the point, it should be obvious at this time that the above-described arrangements are merely illustrative of the application and of the principles of the present invention and numerous modifications thereof may be devised by those skilled in the art without departing from the spirit and scope of the invention.

What is claimed is:

1. An integrated circuit chip mounting arrangement comprising a substrate, electrically conductive electrodes deposited on said substrate immediately adjacent the location where said chip is to be mounted and extending outwardly therefrom, resistor material deposited on said substrate and extending between said electrodes and in intimate contact therewith, said resistor material having a low ohms/square value of 1 to 10 ohms at approximately 400° C., a thin layer of insulating glass covering said resistor material, a thin metallic layer deposited on the upper surface of the glass and being approximately coextensive with the resistor material, the layer of insulating glass and the metallic layer each being 0.5 to 2.0 mils thick, the integrated circuit chip being positioned on the upper surface of the metallic layer and immediately above the resistor material, a layer of eutectic solder on the underside of said chip, said solder having a melting point of approximately 400° C., and means for applying a low voltage of 10–20 volts to the electrically conductive electrodes, said eutectic solder serving to secure said chip in place on the substrate when said low voltage is applied to said electrodes to heat said resistor material to approximately 400° C. and thereby temporarily melt the eutectic solder, the inner ends of the conductive electrodes being perpendicularly extended so as to be substantially coextensive with the length of said chip, the distance between the inner ends of the electrodes being substantially coextensive with the width of said chip, the resistor material fillng the entire gap or space between the conductive electrodes.

* * * * *